(12) United States Patent
Spigelmyer et al.

(10) Patent No.: US 8,387,230 B2
(45) Date of Patent: Mar. 5, 2013

(54) METHOD OF MAKING AN ULTRASONIC TRANSDUCER SYSTEM

(75) Inventors: Matthew Todd Spigelmyer, Spring Mills, PA (US); Derek Ryan Greenaway, Howard, PA (US)

(73) Assignee: TransducerWorks, LLC, Howard, PA (US)

( * ) Notice: Subject to any disclaimer, the term of this patent is extended or adjusted under 35 U.S.C. 154(b) by 216 days.

(21) Appl. No.: 12/870,639

(22) Filed: Aug. 27, 2010

(65) Prior Publication Data

US 2012/0047717 A1 Mar. 1, 2012

(51) Int. Cl.
*H04R 31/00* (2006.01)

(52) U.S. Cl. ......... 29/594; 29/609.1; 428/212; 428/216; 428/336; 428/426; 428/701; 438/695; 438/745; 438/753

(58) Field of Classification Search ................. 29/592.1, 29/594, 609.1; 428/212, 216, 336, 426, 428, 428/432, 701, 702; 438/455–459, 695, 745, 438/753

See application file for complete search history.

(56) References Cited

U.S. PATENT DOCUMENTS

| 5,267,221 | A | * | 11/1993 | Miller et al. ................. 367/140 |
| 5,667,700 | A | * | 9/1997 | Rudigier et al. ................. 216/12 |
| 5,767,020 | A | * | 6/1998 | Sakaguchi et al. ............ 438/705 |
| 6,129,866 | A | * | 10/2000 | Hamanaka et al. ............ 264/1.7 |
| 6,859,984 | B2 | * | 3/2005 | Dinet et al. .................. 29/25.35 |
| 7,053,530 | B2 | * | 5/2006 | Baumgartner et al. ....... 310/334 |

* cited by examiner

*Primary Examiner* — Paul D Kim
(74) *Attorney, Agent, or Firm* — Cuenot, Forsythe & Kim, LLC

(57) ABSTRACT

In a method of making an ultrasonic transducer, a piezoelectric ceramic material that is at least partially covered by metal plating is provided. A plurality of substantially parallel cuts is formed in the plating so as to define a plurality of transducer elements and a ground element. A plurality of conductors is provided. An end portion of each conductor is operatively connected, such as by ultrasonic bonding, to a respective one of the transducer elements or the ground element. Next, a backing material is bonded to the plurality of transducer elements and the ground element such that the end portion of each conductor is sandwiched between the backing material and a respective one of the transducer elements or the ground element. The conductors are bent to allow for operative connection to an ultrasound system. The operative connection between the conductors and the transducer elements is maintained during the bending step.

20 Claims, 2 Drawing Sheets

METHOD OF MAKING AN ULTRASONIC TRANSDUCER SYSTEM

FIELD

Embodiments relate in general to transducers and, more particularly, to ultrasonic array transducers.

BACKGROUND

Ultrasonic array transducers comprise a plurality of transducer elements that are used to transmit and receive ultrasonic energy to generate an image of a target. Each transducer element operates as an independent point source. Generally, the greater the quantity of transducer elements, the greater the quality of the image. Each of these individual transducer elements must be electrically connected to a cable, which is then connected to an ultrasound system. The electrical connection between the individual transducer elements and the cable is typically made using a wire.

In a typical ultrasound array transducer, the transducer elements are out of plane with the cable. As a result, the wires that electrically connect the cable and the transducer elements must be bent 90 degrees to allow connection to the cable. However, making such a bend is difficult to achieve in a straight transducer array and even more difficult in curved transducer arrays because of the lack of strength of the connection between the wire and the transducer elements. Typical connection methods include ultrasonic bonding and wedge bonding. Bonds formed by such methods are weak, and they do not have the strength to withstand the force imposed by when bending the wire 90 degrees. Consequently, the bonds will fail when subjected to the bending force, causing the wires to become disconnected from the transducer elements.

To avoid this problem, the wires are connected to the transducer elements either by hand soldering ribbon wire or by using flexible circuits that rely on mechanical pressure to make electrical contact. Each of these methods has disadvantages. With respect to hand soldering, the heat generated in the process tends to depolarize the piezoelectric ceramic material of the transducer elements, thereby adversely affecting the performance of the transducer (i.e., low and non-uniform signals). On the other hand, the use of a flexible circuit results in several additional layers being placed between the piezoelectric ceramic material of the transducer elements and a backing material. Because the flexible circuit is located within the acoustic path, it can interfere with acoustic performance of the transducer.

Thus, there is a need for a method of making an ultrasonic array transducer that can minimize such concerns.

SUMMARY

In a first respect, embodiments are directed to a method of making an ultrasonic transducer system, which has a transducer element. The transducer element includes a piezoelectric ceramic material that is at least partially covered by a metal plating. A conductor is provided. The conductor has a first end portion. The first end portion of the conductor is operatively connected to the transducer element, such as by ultrasonic bonding. In one embodiment, the conductor can be, for example, a wire.

Next, a backing material is attached to the transducer element such that the first end portion of the conductor is sandwiched between the backing material and the transducer element. Such attachment can be achieved in any suitable way. For instance, the backing material can be bonded to the transducer element using an epoxy.

The conductor is bent such that the operative connection between the conductor and the transducer element is maintained during bending due to, at least in part, the first end portion of the conductor being sandwiched between the backing material and the transducer element. The conductor can be bent at any suitable angle, including at about 90 degrees.

The method can further include the step of operatively connecting a second end portion of the conductor to an ultrasound system. In one embodiment, the second end portion of the conductor can be operatively connected to the ultrasound system by a cable.

In a second respect, embodiments are directed to a method of making an ultrasonic transducer system. The system includes a piezoelectric ceramic material that is at least partially covered by a plating, which can be, for example, a metal plating. A plurality of cuts is formed in the plating so as to define a plurality of transducer elements.

According to the method, a plurality of conductors is provided. Each conductor has a first end portion. The first end portion of each conductor is operatively connected to a respective one of the transducer elements. In one embodiment, the operatively connecting step can be performed by ultrasonic bonding.

A backing material is attached to the plurality of transducer elements such that the first end portion of each conductor is sandwiched between the backing material and a respective one of the transducer elements. In one embodiment, the backing material can be attached to the transducer element using an epoxy.

Next, the conductors are bent. The operative connection between the conductors and the transducer elements is maintained during bending at least because of the first end portion of the conductors being sandwiched between the backing material and the respective transducer elements. In one embodiment, the conductors can be bent at about 90 degrees.

The conductors can include a second end portion. The method can further include the step of operatively connecting the second end portion of each conductor to an ultrasound system. Such operative connection can be achieved in any suitable manner, such as by a cable. In one embodiment, the second end portion of the conductors can be joined. The method can include the step of separating the conductors into a plurality of conductors.

The conductors can be arranged in any suitable manner. For instance, the conductors can be arranged in a staggered manner such that a first subset of the conductors alternate with a second subset of the conductors. The conductors in the first subset can be attached to a first elevation end region of the respective transducer elements. The conductors in the second subset can be attached to a second elevation end region of the respective transducer elements. The first elevation end region can be opposite the second elevation end region.

A ground element and a ground conductor having a first end portion can be provided. The ground element can include a piezoelectric ceramic material that is at least partially covered by a plating. The first end portion of the ground conductor can be operatively connected to the ground element. Such operative connecting can be achieved in any suitable manner, such as by ultrasonic bonding. A backing material can be attached to the ground element such that the first end portion of the ground conductor is sandwiched between the backing material and the ground element. The ground conductor can be bent. During this bending, the operative connection between the ground conductor and the ground element is maintained at least because of the first end portion of the ground conductor being sandwiched between the backing material and the ground element.

In a third respect, embodiments are directed to a method of making an ultrasonic transducer system. The system includes a piezoelectric ceramic material that is at least partially covered by a plating, which can be a metal plating. A plurality of cuts is formed in the plating so as to define a plurality of transducer elements and a ground element.

A plurality of conductors is provided. Each conductor has a first end portion and a second end portion. The first end portion of each conductor is ultrasonically bonded to a respective one of the transducer elements.

A backing material is bonded to the surface of the plating material such that the first end portion of each conductor is sandwiched between the backing material and a respective one of the transducer elements. The conductors are bent at a suitable angle, such as at about 90 degrees. The operative connection between the conductors and the transducer elements is maintained during bending due to, at least in part, the first end portion of the conductors being sandwiched between the backing material and the respective transducer elements. The second end portion of each conductor is operatively connected to an ultrasound system.

The first end portion of one or more ground conductors can be ultrasonically bonded to the ground element. The backing material can also be bonded to the ground element such that the first end portion of each ground conductor is sandwiched between the backing material and the ground element. The one or more ground conductors can be bent such that the operative connection between the ground conductors and the ground element is maintained during the bending step due to, at least in part, the first end portion of the ground conductors being sandwiched between the backing material and the ground element. The second end portion of the one or more ground conductors can be operatively connected to an ultrasound system.

DETAILED DESCRIPTION

Figure 1:
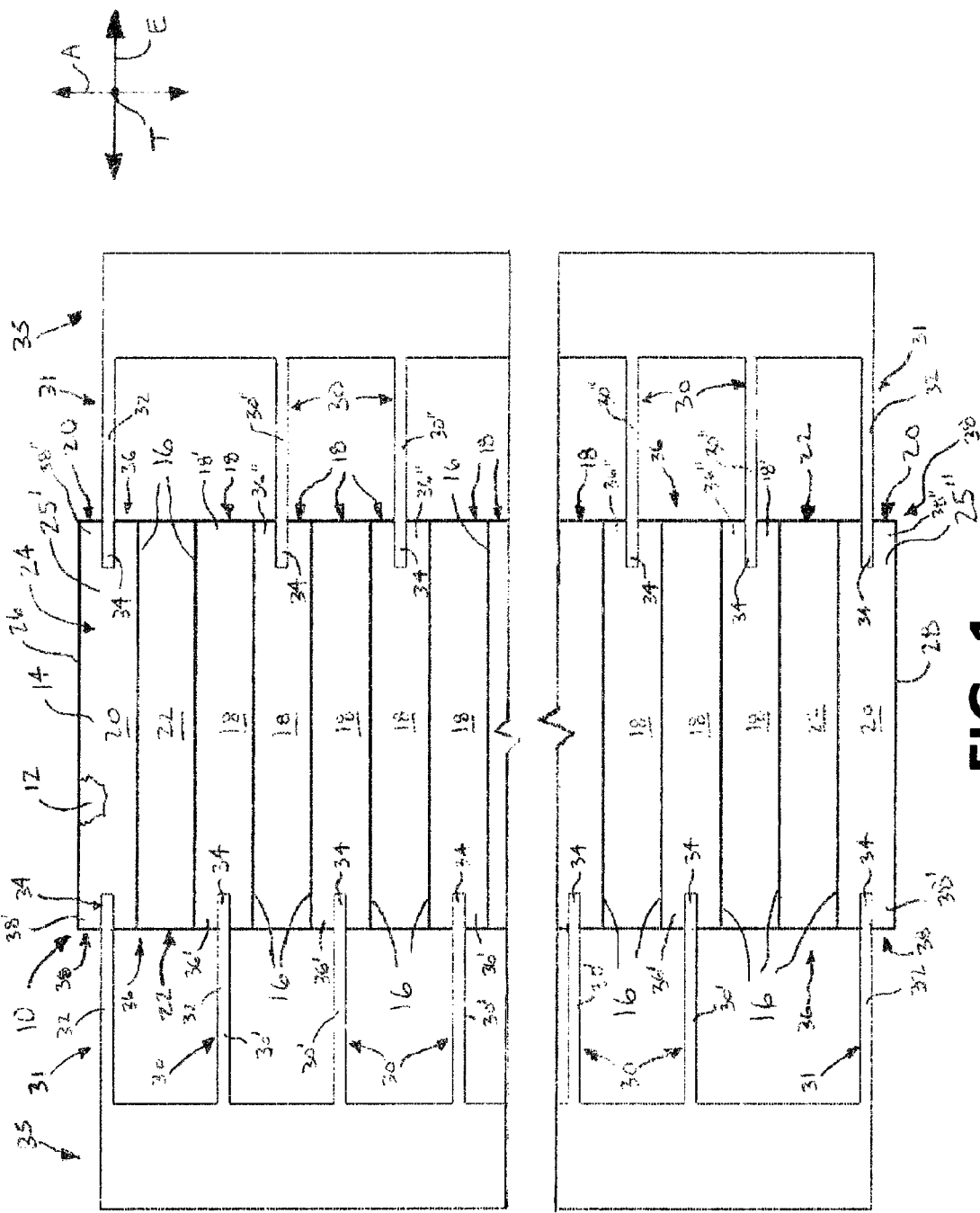
FIG. 1 is a top plan view of an embodiment of a transducer system, showing a plurality of conductors attached to individual transducer elements and a ground element.
Figure 2:
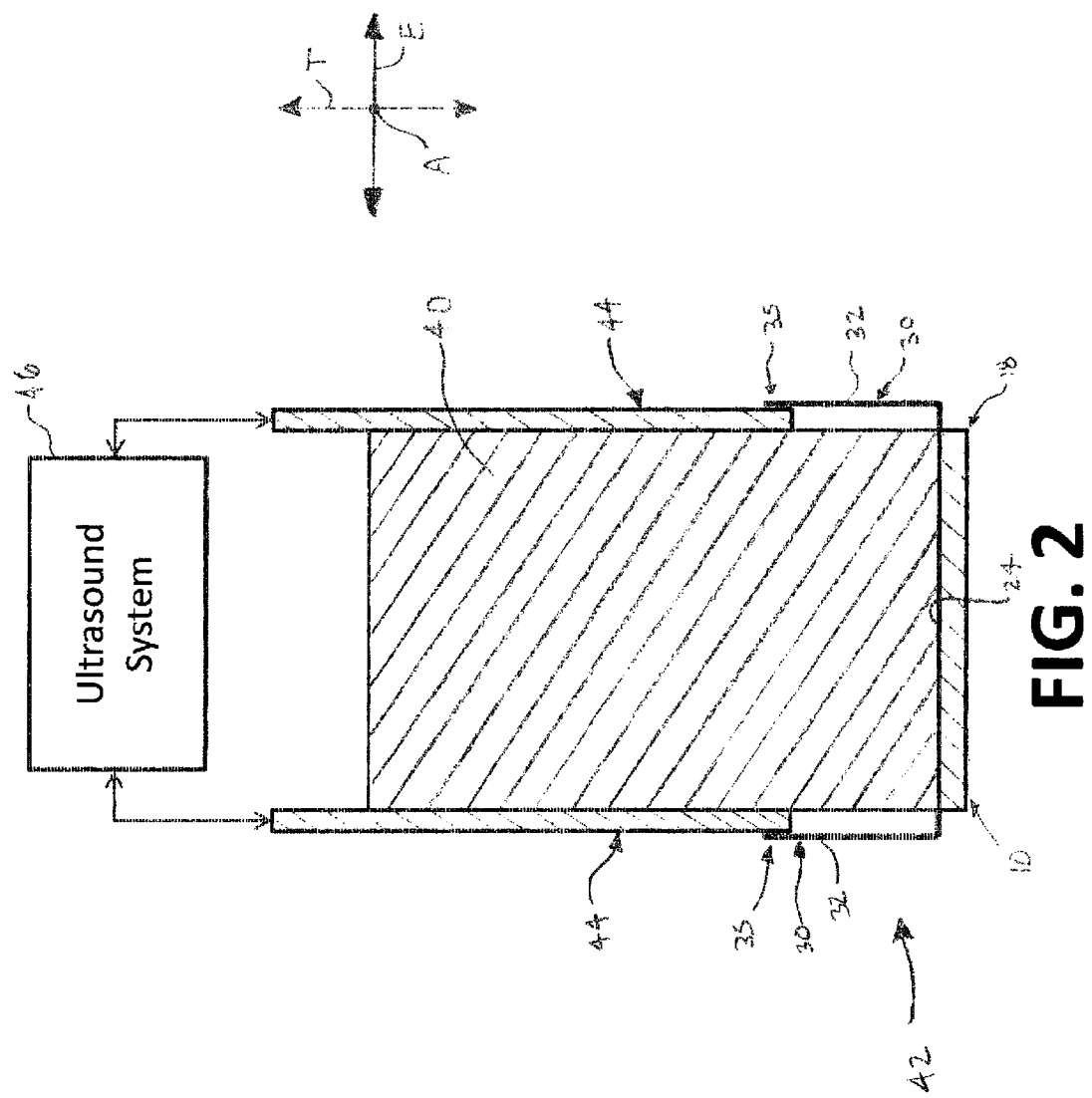
FIG. 2 is a side elevation cross-sectional view of an embodiment of a transducer system, showing the plurality of conductors being bent at about 90 degrees and being operatively connected to an ultrasound system.

Embodiments are directed to a transducer system and an associated manner of making a transducer system. Aspects will be explained in connection with one possible system and method, but the detailed description is intended only as exemplary. Embodiments are shown in FIGS. 1-2, but the embodiments are not limited to the illustrated structure or application. It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details.

According to embodiments herein, a method is provided to facilitate the making of a transducer system. FIG. 1 shows a top plan view of a transducer subassembly 10. The transducer subassembly 10 can have an associated elevation direction E, an azimuth direction A that is transverse to the elevation direction E and a thickness direction T that is transverse to bother the elevation direction E and the azimuth direction A. In FIG. 1, the thickness direction T extends into and out of the page.

The transducer subassembly 10 can include a block of piezoelectric ceramic material 12. Any suitable piezoelectric ceramic material can be used. The block of piezoelectric ceramic material 12 can be provided in any suitable form. In one embodiment, the piezoelectric ceramic material 12 can include a plurality of piezoelectric ceramic pillars embedded in epoxy. The block of piezoelectric ceramic material 12 can at least partly covered by a plating 14 wrapped therearound. Any suitable material can be used for the plating 14. The plating can be made of a conductive material. In one embodiment, plating 14 can be made of metal.

A plurality of elongated parallel cuts 16 can be made along a surface of the plating 14 to define a plurality of transducer elements 18 and a ground element 20. The cuts 16 can extend through the thickness of the plating 14. As a result, each transducer element 18 can be isolated from the other transducer elements 18 and/or the ground element 20. There can be a dead or unused element 22 between the ground element 20 and the nearest transducer element 18' to the ground element 20. The ground element 20 can extend about a first portion 25' of an upper side 24 of the transducer subassembly 10, wrapping around a first side wall 26, extending across a lower side (not shown) of the transducer subassembly 10, and wrapping around a second opposite side wall 28 to a second portion 25" of the upper side 24 of the transducer subassembly 10. The terms "upper" and "lower" are used for convenience to facilitate the discussion and are not meant to be limiting. Indeed, the operational position of the upper side 24 and the lower side (not shown) can vary depending on the application at hand.

According to aspects of the invention, a plurality of conductors 30 can be provided. The conductors 30 can be any suitable material. The conductors 30 can be provided in any suitable form, including, for example, wires 32. The conductors 30 can be provided as a plurality of separate individual conductors. Alternatively, the conductors 30 can be provided such that the conductors 30 are joined together at one end for later separation. FIG. 1 shows an example of such an arrangement. The conductors 30 can have any suitable size and cross-sectional shape.

The conductors 30 can include a first end portion 34 and a second end portion 35. The first end portion 34 of each conductor 30 can be operatively connected to a respective one of the transducer elements 18. Such operative connection can occur in any suitable location. For example, as is shown in FIG. 1, the conductors 30 can be operatively connected to an elevation end portion 36 of each transducer element 18.

The operative connection between the conductors 30 and the transducer elements 18 can be achieved in any suitable manner. For instance, the conductors 30 can be attached to the each transducer element 18, such as to the metal plating 14, by ultrasonic bonding, which includes ultrasonic welding. An ultrasonic wire bonder can be used for such purposes.

The plurality of conductors 30 can be distributed in any suitable manner. Generally, there can be one conductor 30 associated with each transducer element 18. In one embodiment, the plurality of conductors 30 can be provided in a staggered arrangement. That is, a first subset 30' of the conductors 30 can alternate with a second subset 30" of the conductors 30, as is shown in FIG. 1. Each of the conductors 30 in the first subset 30' can be attached to a first elevation end portion 36' of the transducer elements 18. Each of the conductors 30 in the second subset 30" can be attached to a second elevation end portion 36" of the transducer elements 18. The first elevation end portion 36' can be opposite the second elevation end portion 36'. Such a staggered arrangement can be convenient for avoiding overcrowding of individual conductors 30.

One or more ground conductors 31 can be operatively attached to the ground element 20. By operatively attaching a plurality of ground conductors 31 to the ground element 20, redundancy can be provided and signal carrying capacity can be enhanced. The above discussion concerning the conductors 30 and the manner in which they are attached to the transducer elements 18 can apply equally to the ground conductors 31 and the manner in which they are attached to the ground element 20. FIG. 1 shows an embodiment in which four ground conductors 31 are operatively connected to the ground element 20. Two ground conductors 31 can be associated with the ground element 20 proximate to the first side wall 26. One ground conductor 31 can be operatively connected to a first elevation end portion 38' of the ground element 20, and another ground conductor 31 can be operatively connected to a second elevation end portion 38" of the ground element 20. Similarly, two ground conductors 31 can be associated with the ground element 20 proximate to the second side wall 28. One ground conductor 31 can be operatively connected to a first elevation end portion 38' of the ground element 20, and another ground conductor 31 can be operatively connected to a second elevation end portion 38" of the ground element 20.

It should be noted that the above-described connections between the conductors 30 and the transducer elements 18 as well as the ground conductors 31 and the ground element 20 can be considered to be temporary in the sense that the operative connections would not be strong enough to withstand the force of bending the conductors 30 and the ground conductors 31. Accordingly, a backing material 40 (FIG. 2) can be provided. Any suitable backing material 40 can be used.

The backing material 40 can be attached to the upper side 24 of the transducer subassembly 10, as is shown in FIG. 2. Such attachment can be achieved in any suitable manner, including, for example, by the use of a suitable adhesive or bonding material such as an epoxy. As a result, the conductors 30 and the ground conductors 31 can be sandwiched between the backing material 40 and the transducer elements 18 and ground element 20. Thus, the conductors 30 and the ground conductors 31 can be held in place by their respective operative connection to the transducer elements 18 and ground element 20 as well as by their respective engagement between the backing material 40 and the transducer elements 18 and ground element 20.

With the backing material 40, a transducer assembly 42 can be formed. The backing material 40 can provide structural integrity to the transducer assembly 42. As a result, the required support is provided to the conductors 30 so that they can be bent, such as at about 90 degrees or other suitable angle, while maintaining the operative connection between the conductors 30 and the transducer elements 18 as well as between the ground conductors 31 and the ground element 20. In embodiments in which the conductors 30 and/or the conductors 31 are connected together at one end (as is shown in FIG. 1), the conductors 30 and/or the ground conductors 31 can be separated either before or after bending. The conductors 30 and conductors 31 can be operatively connected to an ultrasound system 46 such that electrical signals can be carried to the ultrasound system 46. In one embodiment, the conductors 30 and the conductors 31 can be operatively connected to the ultrasound system 46 by a cable 44 or other signal carrying device.

It should be noted that, when forming a curved transducer array, a relatively thin piece of backing material 40 may initially be attached to the upper side 24 of the transducer subassembly 10. A relatively thin piece of backing material 40 can allow the array to be curved while also maintaining the operative connection between the conductors 30 and the transducer elements 18 as well as between the ground conductors 31 and the ground element 20. If a relative thick piece of backing material 40 is used, it may be difficult or impossible to curve the transducer array. After the array is curved, an additional thicker piece of pre-curved backing material (not shown) may be attached to the relatively thin piece of backing material 40.

In view of the foregoing, it will be appreciated that the system and method described herein can provide numerous benefits. Significantly, the system and method can allow the conductors 30 to be operatively connected to the transducer elements 18 and the ground conductors 31 to be operatively connected to the ground element 20 such that the conductors 30 and the ground conductors 31 can be bent at substantially 90 degrees without adversely affecting these operative connections. Further, the operative connection between the conductors 30 and the transducer elements 18 and the ground conductors 31 and the ground element 20 can be made using ultrasonic wire bonding, a technology that does not degrade transducer performance. Further, the methods described herein avoid the placement of components in the acoustic path of the transducer.

Examples have been described above regarding a method of making an ultrasonic transducer system. While the foregoing description has been provided in connection with a flat transducer array, it will be appreciated that embodiments can be readily applied to a curved transducer array. Thus, it will of course be understood that embodiments are not limited to the specific details described herein, which are given by way of example only, and that various modifications and alterations are possible within the scope of the following claims.

What is claimed is:

1. A method of making an ultrasonic transducer system including a transducer element, the transducer element comprising a piezoelectric ceramic material that is at least partially covered by a metal plating, the method comprising the steps of:
   operatively connecting a first end portion of a conductor to the transducer element;
   attaching a backing material to the transducer element such that the first end portion of the conductor is sandwiched between the backing material and the transducer element; and
   subsequent to the operatively connecting and attaching steps, bending the conductor, whereby the operative connection between the conductor and the transducer element is maintained during the bending step due to the first end portion of the conductor being sandwiched between the backing material and the transducer element.

2. The method of claim 1 wherein the operatively connecting step of is performed by ultrasonic bonding.

3. The method of claim 1 wherein the bending step comprises bending the conductor at about 90 degrees.

4. The method of claim 1 wherein the conductor is a wire.

5. The method of claim 1 further including the step of operatively connecting a second end portion of the conductor to an ultrasound system.

6. The method of claim 5 wherein the second end portion of the conductor is operatively connected to the ultrasound system by a cable.

7. The method of claim 1 wherein the attaching step comprises bonding the backing material to the transducer element using an epoxy.

8. A method of making an ultrasonic transducer system including a piezoelectric ceramic material that is at least partially covered by a plating, a plurality of cuts being formed in the plating so as to define a plurality of transducer elements, the method comprising the steps of:

providing a plurality of conductors, each conductor having a first end portion;

operatively connecting the first end portion of each conductor to a respective one of the transducer elements;

attaching a backing material to the plurality of transducer elements such that the first end portion of each conductor is sandwiched between the backing material and a respective one of the transducer elements; and subsequent to the operatively connecting and attaching steps, bending the conductors, whereby the operative connection between the conductors and the transducer elements is maintained during the bending step due to the first end portion of the conductors being sandwiched between the backing material and the respective transducer elements.

9. The method of claim 8 wherein the operatively connecting step of is performed by ultrasonic bonding.

10. The method of claim 8 wherein the bending step comprises bending the conductors at about 90 degrees.

11. The method of claim 8 wherein the attaching step comprises bonding the backing material to the transducer element using an epoxy.

12. The method of claim 8 further including the step of operatively connecting a second end portion of each conductor to an ultrasound system.

13. The method of claim 12 wherein the second end portion of each conductor is operatively connected to the ultrasound system by a cable.

14. The method of claim 8 wherein the conductors include a second end portion, wherein the second end portion of the conductors are joined, and further including the step of separating the conductors into a plurality of conductors.

15. The method of claim 8 wherein the conductors are arranged in a staggered manner such that a first subset of the conductors alternate with a second subset of the conductors, wherein the conductors in the first subset are attached to a first elevation end region of the respective transducer elements, wherein the conductors in the second subset are attached to a second elevation end region of the respective transducer elements, and wherein the first elevation end region is opposite the second elevation end region.

16. The method of claim 8 further including the steps of:

providing a ground element including a piezoelectric ceramic material that is at least partially covered by a plating;

providing a ground conductor having a first end portion;

operatively connecting the first end portion of the ground conductor to the ground element;

attaching a backing material to the ground element such that the first end portion of the ground conductor is sandwiched between the backing material and the ground element; and bending the ground conductor, whereby the operative connection between the ground conductor and the ground element is maintained during the bending step due to the first end portion of the ground conductor being sandwiched between the backing material and the ground element.

17. The method of claim 16 wherein the step of operatively connecting the first end portion of the ground conductor to the ground element is performed by ultrasonic bonding.

18. A method of making an ultrasonic transducer system, the system including a piezoelectric ceramic material that is at least partially covered by a metal plating, a plurality of cuts being formed in the plating so as to define a plurality of transducer elements and a ground element, the method comprising the steps of:

providing a plurality of conductors, each conductor having a first end portion and a second end portion;

ultrasonically bonding the first end portion of each conductor to a respective one of the transducer elements;

bonding a backing material to the surface of the plating material such that the first end portion of each conductor is sandwiched between the backing material and a respective one of the transducer elements;

subsequent to the ultrasonically bonding and bonding steps, bending the conductors, whereby the operative connection between the conductors and the transducer elements is maintained during the bending step due to the first end portion of the conductors being sandwiched between the backing material and the respective transducer elements; and operatively connecting the second end portion of each conductor to an ultrasound system.

19. The method of claim 18 wherein the bending step comprises bending the conductors at about 90 degrees.

20. The method of claim 18 further including the steps of:

providing at least one ground conductor, each ground conductor having a first end portion and a second end portion;

ultrasonically bonding the first end portion of the at least one ground conductor to the ground element;

bonding the backing material to the ground element such that the first end portion of the at least one ground conductor is sandwiched between the backing material and the ground element;

bending the at least one ground conductor, whereby the operative connection between the at least one ground conductor and the ground element is maintained during the bending step due to the first end portion of the at least one ground conductor being sandwiched between the backing material and the ground element; and operatively connecting the second end portion of the at least one ground conductor to an ultrasound system.

* * * * *